United States Patent [19]
Günter et al.

[11] Patent Number: 4,992,694
[45] Date of Patent: Feb. 12, 1991

[54] PIEZOELECTRIC CRYSTAL ELEMENT ON THE BASIS OF GAPO4

[75] Inventors: Engel Günter, Leitring; Peter W. Krempl, Graz/Ragnitz, both of Austria

[73] Assignee: AVL Gesellschaft Für Verbrennungskraftmaschinen Und Messtechnik M.B.H. Prof.Dr.Dr.h.c. Hans List, Graz, Austria

[21] Appl. No.: 437,600

[22] Filed: Nov. 17, 1989

[30] Foreign Application Priority Data

Nov. 25, 1988 [AT] Austria ................................ 2909/88

[51] Int. Cl.$^5$ .......................................... H01L 41/08
[52] U.S. Cl. ................................................ 310/360
[58] Field of Search ............................... 310/360, 361

[56] References Cited

U.S. PATENT DOCUMENTS 3,122,662 2/1964 Mason .................................. 310/360

FOREIGN PATENT DOCUMENTS

| 379831 | 3/1986 | Austria . | |
|---|---|---|---|
| 0069112 | 5/1986 | European Pat. Off. . | |
| 0115711 | 9/1980 | Japan | 310/360 |
| 0114899 | 9/1981 | Japan | 310/360 |

Primary Examiner—Mark O. Budd
Attorney, Agent, or Firm—Watson, Cole, Grindle & Watson

[57] ABSTRACT

In order to improve the temperature stability of piezoelectric and elastic properties of piezoelectric crystal elements based on GaPO$_4$, preferably for resonator applications, and to facilitate alignment when the crystal elements are cut from the raw crystal bars, the proposal is put forward that the principal plane H of the crystal element be parallel to a cutting plane, which is generated by rotating a hexagonal prism face of a raw crystal bar, which lies parallel to the optical axis, around one of the two-fold crystallographic symmetry axes $a_1$, $a_2$ or $a_3$ through an angle $\theta$ of $-5°$ to $-22°$.

7 Claims, 3 Drawing Sheets

PIEZOELECTRIC CRYSTAL ELEMENT ON THE BASIS OF GAPO₄

BACKGROUND OF THE INVENTION

This invention relates to a piezoelectric crystal element on the basis of $GaPO_4$, preferably for resonator applications, with plane-parallel, plane-convex or biconvex top and bottom faces, possibly for attaching electrodes, and with a principal plane lying parallel to one of the plane faces or symmetrical to the bi-convex faces.

DESCRIPTION OF THE PRIOR ART

As described in EP-A-069 112 quartz-homeotypical crystals of point group 32 and the total formula of $ABO_4$, above all, piezoelectric crystals from the group $GaAsO_4$, $GaPO_4$, $AlAsO_4$, $FeAsO_4$, $FePO_4$, $MnPO_4$, $MnAsO_4$, are known to have outstanding temperature stability with regard to some of their major physical properties, especially as regards piezoelectric and elastic parameters, which makes them particularly suitable for use in piezoelectric resonators. The favorable properties of these crystals are due to a special characteristic of the phonon spectrum, i.e., in the temperature range of 20°–500° C. the lowest frequency of the totally symmetric phonon mode is subject to a shift of not more than 15 percent. The above paper gives a number of applications of such crystal elements, with special emphasis on $GaPO_4$ crystals.

It is also known that the above crystals may be produced synthetically by hydrothermal methods, as is described in AT-PS 379 831, for example.

As regards piezoelectric resonators with crystals of trigonal symmetry, among other $LiNbO_3$, it is common knowledge to utilize the thickness shear mode. In particular, such applications have been known for α-quartz and α-$AlPO_4$, in which case it should be noted that these crystals are not as resistant to high temperatures as $GaPO_4$, for instance, and that the above feature of the phonon spectrum does not apply.

A good summary of numerous methods and aspects of resonator manufacture from quartz is contained in "Quartz Vibrators and their Applications" (P. Vigoureux, His Majesty's Stationery Office, London, 1950).

For applications of the thickness shear mode the relevant literature gives special cutting angles, so-called rotated Y-cuts, both for quartz and for $AlPO_4$, which are of importance when the crystal elements are cut from the raw crystal bar.

These cutting angles are described in the above-mentioned book on "Quartz Vibrators and their Applications" for quartz, and in "Crystal Growth", vol. 80, 1987, pp 133-148, J. C. Jumas et al. for $AlPO_4$.

In $GaPO_4$ crystals, however, which have the same crystal structure, it has been found unexpectedly that these cutting angles or planes are possible but not optimal. On the one hand the relation between the known cutting planes and the angles between growth areas and crystallographic axes, which may be recognized macroscopically in the raw crystal bars, is in no way satisfactory, on the other hand the theoretically possible electromechanical coupling is not fully utilized by these cutting planes, in addition to a negative temperature coefficient of the resonator frequencies.

SUMMARY OF THE INVENTION

It is the object of the present invention, firstly, to indicate cutting planes for piezoelectric crystal elements on the basis of $GaPO_4$, which will permit comparatively simple alignment if used with the raw crystal bars obtainable with current methods of growth, and which have slightly positive temperature coefficients of the resonant frequencies at room temperature and only a slight tendency towards sympathetic resonance, and, secondly to indicate new crystals on the basis of $GaPO_4$, which will essentially maintain the above features in the same range of cutting angles.

In the invention this object is achieved by having the principal plane of the crystal element run parallel to a cutting plane, which cutting plane is generated by rotating a hexagonal prism face of a raw crystal bar, which is parallel to the optical axis (c), around one of the two-fold crystallographic symmetry axes ($a_1$, $a_2$, or $a_3$) through an angle $\theta$ of $-5°$ to $-22°$. If the raw crystal is imagined as being placed in a rectangular coordinate system with axes X, Y, Z, i.e., in such a way that one of the two-fold symmetry axes . $a_i$ is parallel to the X-axis and the three-fold symmetry axis c (optical axis) is parallel to the Z-axis, all hexagonal prism faces are parallel to the Z-axis. Departing from one of the hexagonal prism faces the raw crystal bar must now be tilted about the X-axis through an angle $\theta$ of $-5°$ to $-22°$, in order to rotate the top and bottom faces of the crystal elements to be cut from the bar into the cutting plane.

In a preferred variant of the invention the angle $\theta$ is between $-13°$ and $-17°$.

Acccording to the invention the favorable properties of the piezoelectric crystal element will be maintained even if the cutting plane parallel to the principal plane of the crystal element is permitted to rotate around the optical axis through an angle $\beta$ of $-5°$ to $5°$ prior to its rotation around one of the two-fold crystallographic symmetry axes. In order to facilitate alignment before cutting slight tilts of the rotational axis may be tolerated.

It has been found unexpectedly that the proposed cutting plane and cutting angle do not only apply to the pure substance $GaPO_4$, but that, as shown in a further development of the invention, the crystal element may be cut from a crystal whose total formula is $Ga_{1-x}M_x PO_4$, M standing for a trivalent element and x satisfying $0 \leq X < 0.5$. It is thus possible to use mixed crystals which are derived from the pure substance by replacing half of the Ga atoms by a trivalent element. According to the invention special advantages may be gained if parts of the gallium are replaced by aluminum, since aluminum is considerably less expensive and the favorable properties of $GaPO_4$ will still be maintained by the mixing ratio indicated.

DESCRIPTION OF THE DRAWINGS

Following is a more detailed description of the invention as illustrated by the attached drawings, in which.

The use of conventional techniques for growing crystals based on $GaPO_4$ will yield raw crystal bars 1 of a marked habit with trigonal rhombohedral faces 2, hexagonal prism faces 3, and pinacoid faces 4. This is shown in detail in FIGS. 1 and 2 giving a schematic view of a typical raw crystal bar. In order to facilitate definition of cutting angles and the cutting plane E, the axes X, Y, Z of the rectangular coordinate system are indicated, which are related to the two-fold crystallographic symmetry axes $a_i$ ($i=1-3$) and the optical axis c (three-fold symmetry axis) as following. X is parallel to one of the axes $a_i$ such that its direction is given by the positive sign of the charge generated by the piezoelectric effect, an optically left-handed crystal requiring the application of pressure, an optically right-handed crystal tension. The Z-axis is parallel to the optical axis c, and Y is perpendicular to X and Z, such that a right-handed system of axes is formed. Thus the Y-axis does not correspond to any of the crystallographic symmetry axes. Another possible X-axis is denoted X*. The plane-parallel top and bottom faces 5 of a disk-shaped piezoelectric crystal element 6 are parallel to the principal plane H as well as parallel to the cuting plane E subtending an angle $\theta$ of $-5°$ to $-22°$ with the hexagonal prism face 3 parallel to the Z-axis.

Crystal cuts whose thickness direction (thickness d being defined as the smallest dimension) is in the direction of the Y-axis, are called Y-cuts. If such a Y-cut is rotated clockwise around the X-axis through an angle 0, a rotated Y-cut is obtained. Such cuts are of great importancce for resonators made from crystals of trigonal symmetry, as they will permit only one of the three possible acoustic resonance waves to be excited piezoelectrically.

Well-known examples are quartz and berlinite ($\alpha$-SiO$_2$ and $\alpha$-AlPO$_4$). In the former, the so-called AT-cut is approximately at an angle of $\theta = -35°$, and the CT-cut $-38°$, in the latter a cut which is also termed AT, is at $\theta = -30°$.

Figure 1:
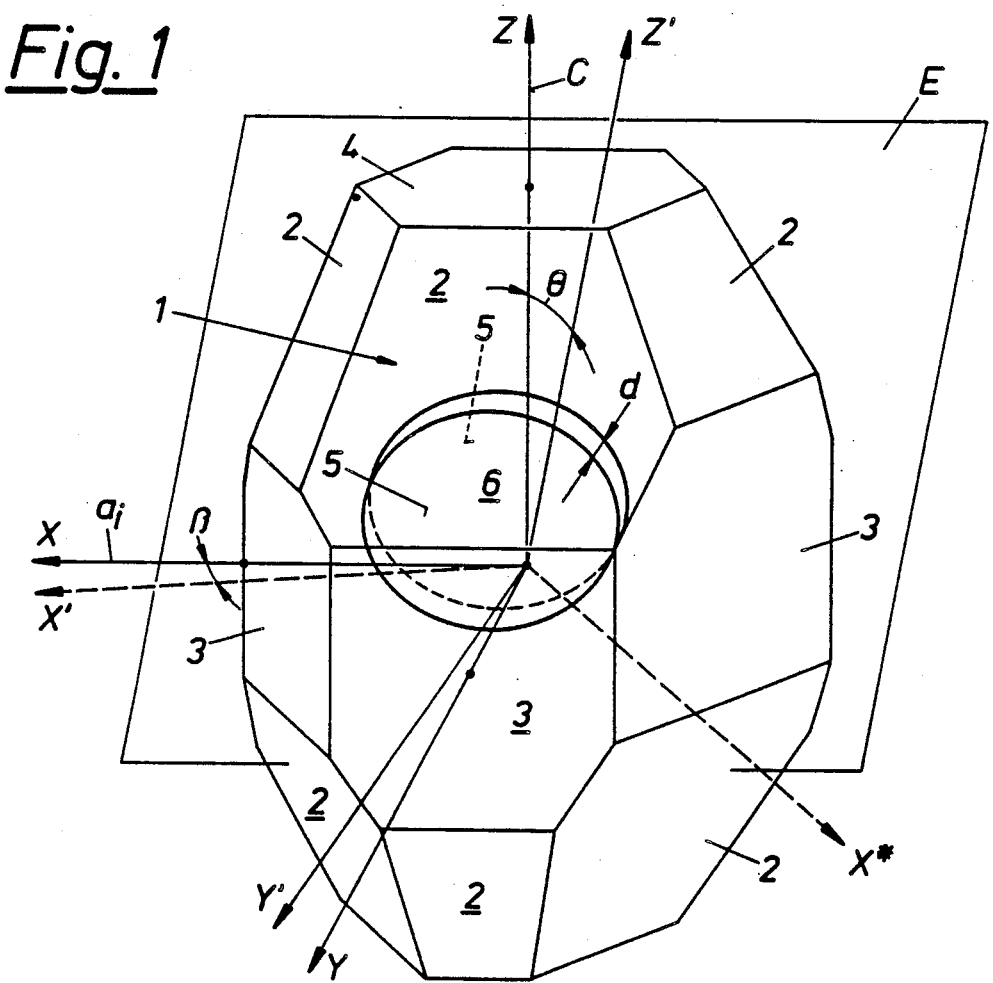
FIG. 1 presents a crystal element according to the invention, together with the raw crystal bar, FIG. 2 gives a secton along the Y-Z-plane of FIG. 1, FIGS. 3, 4, 5 present measured curves of the piezoelectric element, and FIG. 6 gives a preferred arrangement of the pick-up electrodes relative to the crystallographic axes.

In view of the identical crystal structure of GaPO$_4$, it would be obvious to use corresponding cuts of a GaPO$_4$ crystal in the range of approximately 30° to $-40°$. However, th temperature coefficient of the resonance frequencies of such crystal cuts is $-15$ to $-30$ ppm/K, which is unfavorable with regard to both value and sign. Moreover, the typical habit as shown in FIG. 1 will lead to an unfavorable ratio of yield and waste, especially in smaller raw crystal bars (e.g., of less than 10 g weight), and will hardly facilitate pre-alignment in crystal processing, in addition to yielding rather low frequency constants of 1,100 KHzmm approximately.

By comparison, desirable crystal elements should have a temperature coefficient either slightly positive or close to zero, and should permit a favorable yield from the crystals obtainable with the use of current growth techniques, and they should offer a certain ease of alignment in crystal processing, in addition to having a higher frequency constant.

The above requirements are met by selection of a rotated Y-cut according to claim 1. For ambient temperature as a reference temperature the temperature coefficients of the resonance frequencies are on either side of the zero line.

Figure 2:
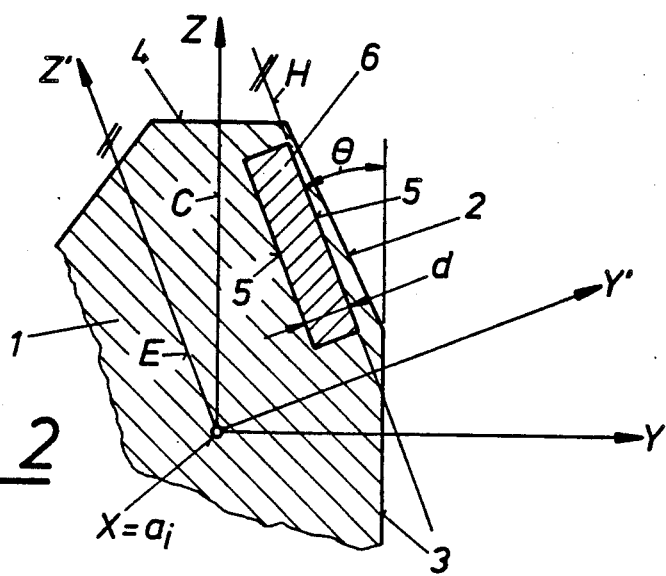
FIG. 2 shows clearly that a principal plane H containing the plane top face 5 of the crystal element 6 is parallel to the cutting plane E. If the crystal element has a plane-convex configuration the principal plane is parallel to the plane top face, if it has a bi-convex configuration the principal plane and the symmetry plane coincide.

As is seen in FIG. 2 the yield of crystal elements rises especially for cuts between $-20°$ and $-22°$ since the angle between the rhombohedral face 2 and the imaginary extension of the hexagonal prism face 3 is 21.02°. This will also aid alignment, since the first alignment in crystal processing may be made relative to this face, and since the hexagonal prism face may serve as a reference for the rotation back to the preferred angles. Besides, the frequency constants are in the range of approximately 1,240 to 1,440 KHzmm, which is considerable in view of the high density of the material.

As boundaries of growth zones in the area below the pick-up electrodes may have an adverse effect on the vibration behavior, it is proposed that only zone-free crystal material be used. Zone boundaries are characterized by the frequent occurrence of linear crystal defects and by the possibility of slight tilts of the crystal axes of the regions divided by zone boundaries, both of which have undesirable effects on the elastic and piezoelectric behavior. In principle any growth zone may be used, although the Z-zone (growth at the pinacoid face 4) or the R-zone (growth at the rhombohedral face 2) should be preferred. Further improvement may be achieved if the infrared absorption $\alpha$ of the raw crystal bar is less than 0.8 cm$^{-1}$ in the wave range of 3 $\mu$m. This will ensure good machining of the crystal (cutting, lapping, polishing), and the Q-factor of the resonator will no longer be determined predominantly by the attenuation in the crystal, both effects being obtained above all for $\alpha$-values that are large relative to the above limiting value of $\alpha$. As the value of $\alpha$ is proportional to the content of extraneous traces of war in the crystal, this content of water will determine the extent of viscoelastic attenuation in the crystal.

It is furthermore recommended that a high quality of the crystal surfaces be observed. Although lapping of the surface of the crystal element will give satisfactory results, the best results will be achieved if the surfaces are polished. In the former instance electrode adherence will be superior, whereas in the latter resonator Q-factor will be generally higher.

As regards geometrical tolerances, another look at FIG. 1 shows that the X-axis and the corresponding two-fold symmetry axis $a_i$ need not coincide precisely, but that a small tolerance of, say, $\beta = -5°$ to $+5°$, i.e. a slight tilt into a position X' in the X-Y-plane, is possible without involving a major change. The coordinate system tilted by the angle $\theta$ is denoted Y', Z'.

Figure 3:
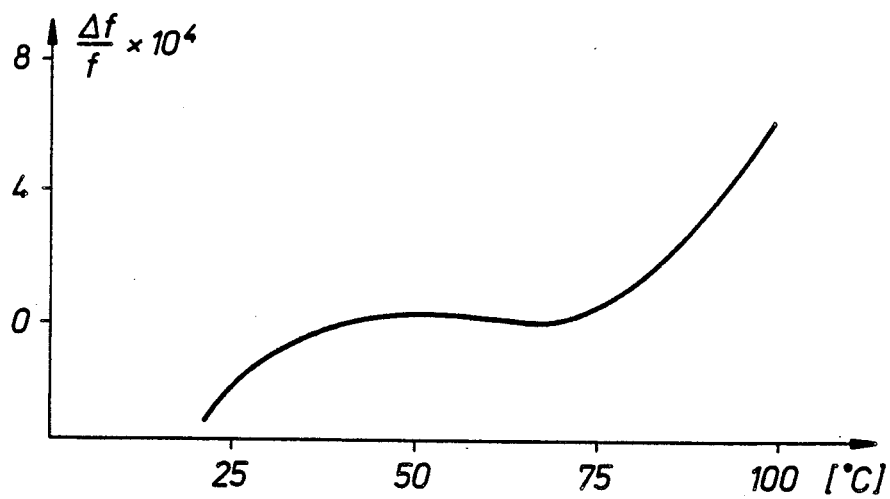

The relative frequency change $\Delta f/f$ depending on the temperature T in °C. of a GaPO$_4$ crystal element according to the invention is presented in FIG. 3. Particularly favorable values are to be expected in the temperature range between 25° and 75° C.

Figure 4:
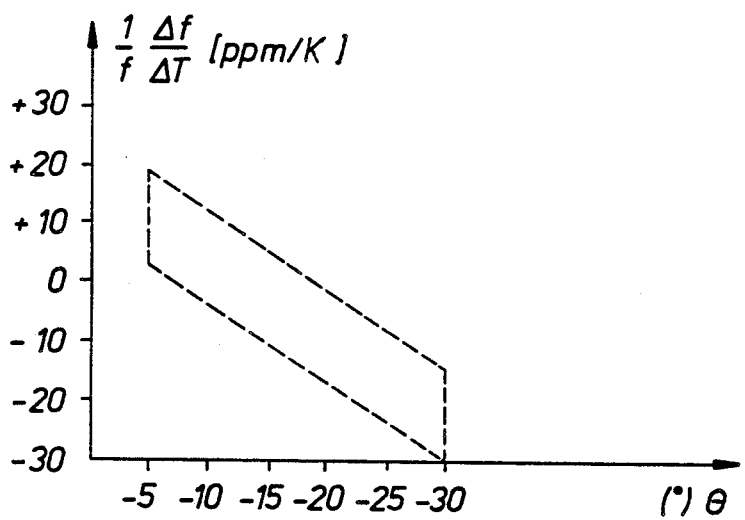
Figure 5:
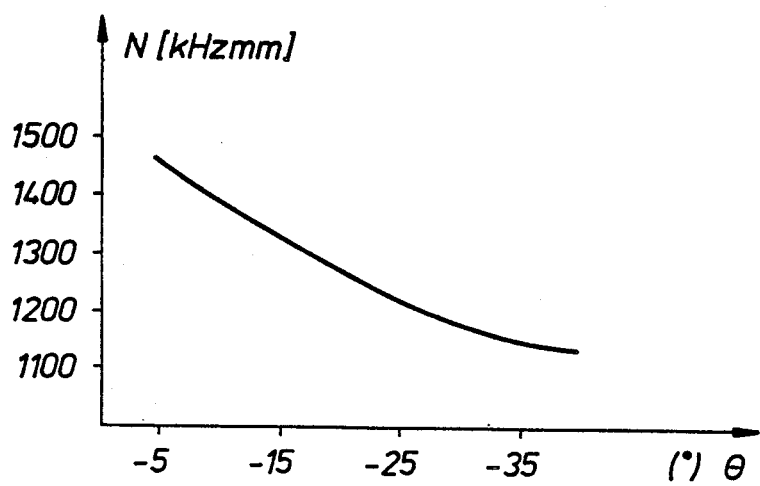

FIG. 4 presents the measured dependence of the temperature coefficient on the cutting angle $\theta$ for a temperature range of 25° to 50° C., FIG. 5 the dependence of the frequency constant N in KHzmm on the angle $\theta$ of the cutting plane for crystal elements on the basis of GaPO$_4$.

Figure 6:
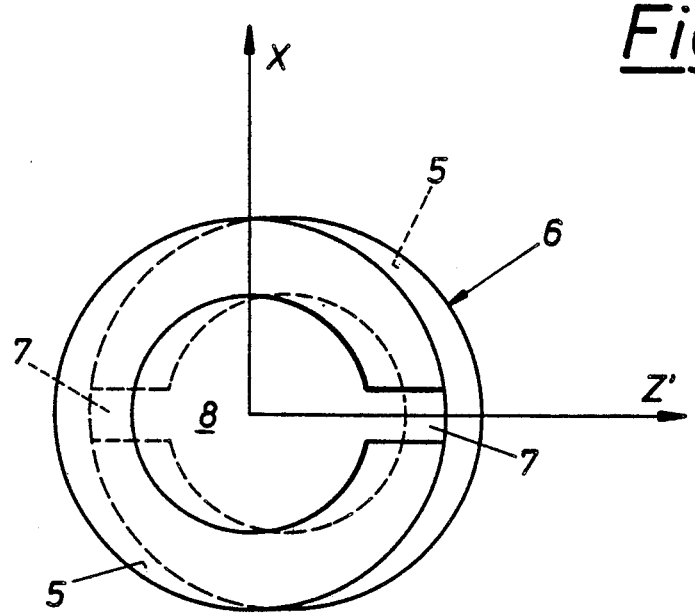

In order to prevent the electrode bridges 7 connecting the electrodes 8 from affecting the vibration behavior of the resonator, it is proposed in FIG. 6 that these electrodes should be positioned along the Z'-axis.

We claim:

1. A piezoelectric crystal element of the type of GaPO$_4$, being cut from a raw crystal bar, said crystal element having plane-parallel, plane-convex or bi-convex top and bottom faces, defining a principal plane lying parallel to one of said plane faces or lying symmetrical to one of said bi-convex faces, wherein said principal plane of said crystal element runs parallel to a cutting plane, which cutting plane is generated by rotating a hexagonal prism face of said raw crystel bar, which hexagonal prism face is parallel to the optical axis c, around one of the two-fold crystallographic symmetry axes $a_1$, $a_2$, or $a_3$ through an angle $\theta$ of $-5°$ to $-22°$.

2. A piezoelectric crystal element according to claim 1, wherein said angle $\theta$ is between $-13°$ and $-17°$.

3. A piezoelectric crystal element according to claim 1 wherein said cutting plane parallel to said principal plane of said crystal element is permitted to rotate around the optical axis c through an angle $\beta$ of $-5°$ to $+5°$ prior to its rotation around one of the two-fold crystallographic symmetry axes $a_1$, $a_2$, or $a_3$.

4. A piezoelectric crystal element according to claim 1, wherein said element is cut from a raw crystal bar whose total formula is $Ga_{1-x}M_xPO_4$, M standing for a trivalent element and x satisfying $0 \leq x < 0.5$.

5. A piezoelectric crystal element according to claim 4, wherein M stands for aluminium.

6. A piezoelectric crystal element according to claim 1, for resonator applications.

7. A piezoelectric crystal element according to claim 4, for resonator applications.

* * * * *

UNITED STATES PATENT AND TRADEMARK OFFICE
CERTIFICATE OF CORRECTION

PATENT NO. : 4,992,694

DATED : February 12, 1991

INVENTOR(S) : Gunter Engel et al

It is certified that error appears in the above-identified patent and that said Letters Patent is hereby corrected as shown below:

On the title page item [19] should read --Engel et al--; and

[75] Inventors: Günter Engel, Leitring; Peter W. Krempl, Graz/Ragnitz; Josef M. Stadler, Graz, all of Austria Signed and Sealed this Thirtieth Day of June, 1992

Attest:

DOUGLAS B. COMER

*Attesting Officer*     *Acting Commissioner of Patents and Trademarks*